United States Patent [19]
Richards et al.

[11] Patent Number: 5,764,065
[45] Date of Patent: Jun. 9, 1998

[54] REMOTE CONTAMINATION SENSING DEVICE FOR DETERMINING CONTAMINATION ON INSULATION OF POWER LINES AND SUBSTATIONS

[76] Inventors: Clyde N. Richards, 100 Molina Rd., Peralta, N. Mex. 87042; Joseph D. Renowden, 6033 Eagle's Nest Dr., Jupiter, Fla. 33458

[21] Appl. No.: 716,694

[22] Filed: Sep. 20, 1996

[51] Int. Cl.$^6$ ................................. G01R 31/12
[52] U.S. Cl. ................... 324/551; 324/552; 324/519; 324/670; 340/647; 364/492
[58] Field of Search .................. 340/647; 361/62; 324/551, 552, 519, 670; 364/492

[56] References Cited

U.S. PATENT DOCUMENTS

| | | |
|---|---|---|
| 3,626,286 | 12/1971 | Rauchwerger . |
| 3,710,244 | 1/1973 | Rauchwerger . |
| 4,385,271 | 5/1983 | Kurtz ............................. 324/551 |
| 4,626,774 | 12/1986 | Regtien . |
| 4,758,962 | 7/1988 | Fernandes ....................... 324/127 |
| 5,068,617 | 11/1991 | Reich . |
| 5,386,192 | 1/1995 | Marrone . |
| 5,396,180 | 3/1995 | Hampton ......................... 324/551 |
| 5,402,075 | 3/1995 | Lu et al. . |

*Primary Examiner*—Ernest F. Karlsen
*Assistant Examiner*—Jose M. Solis
*Attorney, Agent, or Firm*—Gudrun E. Huckett; Robert W. Becker & Associates

[57] ABSTRACT

A remote contamination sensing device for contamination on insulation of electric power lines and substations includes a data logger and a supporting structure to which a sensing capacitor with at least two conductors is attached such that the conductors are spaced apart and insulated from each other. A capacitance measuring device, for measuring capacitance data between the conductors, is connected to the data logger. A hygrometer, for measuring the relative humidity of the ambient air, is also connected to the data logger. A first temperature sensor, for measuring the ambient temperature, and a second temperature sensor, for measuring the surface temperature of the capacitance sensor, are connected to the data logger. The measured capacitance data, relative humidity data, ambient temperature data, and surface temperature data are stored in the data logger. A computer is provided for processing the capacitance data, relative humidity data, ambient temperature data, and surface temperature data to determine the level of contamination based on calibration data stored in the computer.

6 Claims, 4 Drawing Sheets

> # 5,764,065

REMOTE CONTAMINATION SENSING DEVICE FOR DETERMINING CONTAMINATION ON INSULATION OF POWER LINES AND SUBSTATIONS

BACKGROUND OF THE INVENTION

The present invention relates to a remote contamination sensing device for determining surface contamination on the insulation of power lines and substations, in particular, for measuring the amount of electrolytic salts present on the surface of high voltage insulators of a high voltage transmission line (power line) and its substations.

Power outages caused by contamination on the insulation of high voltage power lines and in substations are a problem that utility companies worldwide are faced with frequently. High voltage insulators used for electrical power transmission and distribution throughout the world are vulnerable to dielectric failure due to a phenomenon referred to as "contamination flashover". This phenomenon occurs after a layer of contaminants such as sea salt, airborne pollutant particles from industrial or agricultural sources, soot particles etc., has been deposited on the insulator surface. If the insulator surface becomes wet by condensation, fog, rain etc., the electrolytic salts in the layer of contaminants dissolve and form an electrically conductive water film. If the electrolyte concentration is great enough, electrical discharge occurs across the insulator causing a power outage.

Most insulator contamination in coastal areas is due to airborne sea salts. These salt particles result from break-up of sea water bubbles and splashing of sea water drops during agitated seas. Small droplets of sea water are entrained in the air. The water evaporates leaving behind a dry salt particle. The concentration of sea salt in the air and the deposition of sea salt on power line insulators are a function of wind speed.

Natural cleaning mechanisms for removing the salt contamination are rain and heavy dew. Rainfall of more than about 2 cm is effective in removing salt contamination. Heavy dew, when occurring every night, is also an efficient cleaning agent.

Contamination-caused outages occur mostly during clear, calm conditions, late at night or early in the morning. It has been found that outages are commonly related to the following weather pattern. First, an extended period (several weeks) of dry weather with high winds for a few days occurs. During this time no scintillation activity is observed, apparently indicating a sound insulation system. Then, a night of clear and calm weather occurs. Late that night, or early the next morning, multiple flashovers take place, with or without fog being present.

Condensation is the only mechanism by which insulators can become wet during clear weather conditions. The presence of contamination and radiative cooling of the insulation surface may enhance condensation on insulator surfaces. For example, the hygroscopic effect of sea salt causes condensation to begin at relative humidity of 60%. Some salts such as potassium carbonate cause condensation to begin already at a relative humidity of 45%.

Radiative cooling of the insulator by long-wave radiation occurs under clear skies. When the weather conditions are clear and calm, the insulation can cool below ambient temperature and may even reach the dew point temperature. This will, in turn, result in condensation even though the surface of the insulator is not contaminated. Wind, on the other hand, will warm the insulation surface to the ambient temperature. If the relative humidity is less than 100%, the wind will evaporate liquid from the surface of the insulation. Therefore, there are few contamination-related flashovers during windy conditions.

Thus, contaminated insulation performs well as long as it is dry. In certain situations, it also performs well in wet conditions, depending on the wetting mechanism. However, at a great level of contamination and under condensation conditions, the behavior of the insulation begins to change. At the outset of condensation, when the deposited droplets are too small to be affected by the electric fields at the insulator surface, leakage current across the insulator increases only slightly and no scintillation is observed. Scintillation usually begins to occur about 30 min. after the onset of high relative humidity (>90%) because then the droplets have grown to a size that is affected by the electric fields. Flashovers have been observed within 30 min. to 2 hours after the onset of high humidity.

In order to prevent flashover situations, many power companies send out cleaning crews to wash off the insulation. Since there is no indication as to when flashovers are imminent, the crews must be sent out frequently on a regular schedule. This is time-consuming, labor-intensive, and thus very expensive. Also, contamination can occasionally build faster then the cleaning schedule and produce unexpected outages. There are also numerable other undesirable consequences of flashovers, from excessive fault current "duty" on circuit breakers and power transformers to damaging insulator attachment hardware, overhead groundwires, and other components of the power system to potentially initiating a system instability that cascades into a widespread power outage. If there were a way to detect a threshold contamination level indicating a critical flashover situation, the frequency of such cleaning operations could be cut down greatly and operating costs could be reduced.

Contamination levels can be measured by swabbing the surface of the insulator, dissolving the removed contaminants in water, and measuring the conductivity of the resultant water. However, this is very labor intensive, requiring personnel to access the contaminated insulation on operating facilities. This is not a practical means of monitoring the daily buildup of contamination.

It is also possible to measure the leakage current across the insulator, but this method is very insensitive and inaccurate except just prior to dielectric failure of the insulator. The leakage current is a complex and dynamic function of a combination of contamination and the amount of water. The use of leakage current as a parameter for determining the level of contamination has been found to be limited. It cannot be used to provide accurate contamination levels during conditions in which the relative humidity is less than 90%. The leakage current can only be used to determine contamination levels during conditions which are likely to produce flashovers. Basically, the leakage current does not provide a reliable actionable early warning (see comparative experiments infra).

Another approach to provide data in regard to the contamination level is the use of weather data. Empirical relationships have been determined between wind speed and contamination levels in coastal areas. A further weather-related parameter is the amount of rain (rain can wash off contamination). However, to date these methods are rather crude and have not been shown to be able to be used universally.

From U.S. Pat. No. 5,386,192 an apparatus for checking and cleaning contamination of electric insulators is known. The apparatus comprises a probe insulator with an internal cavity. A cold fluid is circulated through the internal cavity to cool the probe insulator to a temperature at which the external humidity condenses on the probe insulator. The surface conductivity of the probe insulator is measured and, when the surface conductivity surpasses a critical value, a washing system is activated to remove the contaminants. This apparatus does not comprise a sensing capacitor and the contaminant level is not determined based on capacitance. The device also does not include a hygrometer and sensing devices for the ambient and surface temperature.

U.S. Pat. No. 3,710,244 and 3,626,286 disclose a capacitance probe for detecting moisture in soil, for example, to control an irrigation system. The probe is embedded in the soil and consists of two spaced apart, insulated elements connected to an electronic control device. The probe is thus a capacitor with a variable dielectric medium and can be calibrated accordingly to provide correct readouts of the water content. U.S. Pat. No. 5,068,617 discloses a similar capacitive device for measuring changes in liquids such as changing mixing ratios. Neither one of these devices relates to detecting contamination on insulators of power lines.

U.S. Pat. No. 4,626,774 relates to a dew-point measuring instrument with a capacitive dew-point sensor comprising comb electrodes and a temperature sensor. The capacitance between the electrodes changes as a function of the dew layer forming thereon. One problem encountered with such dew-point measuring instruments is contamination of the condensation surface. The contamination is measured with a phase measuring circuit based on the absolute value of the phase angle of impedance becoming smaller with increasing contamination. Thus, determination of contamination is not based on capacitance changes.

U.S. Pat. No. 5,402,075 discloses a moisture sensor comprising a sensing capacitor and a reference capacitor which is insulated from exposure to the surrounding so as not to come into contact with moisture. The capacitors are energized by voltage square waves. The phase shift of the square waves of the sensing capacitor and the reference capacitor is used to detect moisture. This reference does not relate to detecting contamination of power line insulators by measuring capacitance.

None of the above prior art references disclose a device for remote-sensing surface contamination on insulators of power lines as a means to predict and potentially prevent flashovers.

It is therefore an object of the present invention to provide a remote contamination sensor for power lines which reliably determines the level of contamination to indicate, based on the level of contamination, the imminent danger of flashover of the insulation with an actionable amount of warning time.

SUMMARY OF THE INVENTION

The remote contamination sensing device of the present invention for contamination on insulation of electric power lines and substations is primarily characterized by:
    a data logger;
    a supporting structure;
    a sensing capacitor comprising at least two conductors attached to the supporting structure so as to be spaced apart and insulated from each other;
    a capacitance measuring device, for measuring the capacitance between the conductors, connected to the data logger;
    a hygrometer, for measuring the relative humidity of the ambient air, connected to the data logger;
    a first temperature sensor, for measuring the ambient temperature, connected to the data logger;
    a second temperature sensor, for measuring the surface temperature of the capacitance sensor, connected to the data logger;
    the measured capacitance data, the measured relative humidity data, the measured ambient temperature data, and the measured surface temperature data being stored in the data logger;
    a computer for processing the capacitance data, the relative humidity data, the ambient temperature data, and the surface temperature data to determine the level of contamination based on calibration data stored in the computer.

Preferably, the at least two conductors are insulated wires wound spirally about the supporting structure.

Advantageously, the at least two conductors are metal films deposited onto the support structure.

The present invention also relates to a method of remote-sensing contamination on insulation of electric power lines and substations. The method of the present invention is primarily comprised of the steps of:
    attaching a sensing capacitor to a supporting structure, the sensing capacitor comprising at least two conductors so as to be spaced apart and insulated from one another;
    placing the supporting structure with the sensing capacitor proximate to the insulation to be monitored;
    measuring the capacitance between the conductors and storing the measured capacitance data in a data logger;
    measuring relative humidity of the ambient air and storing the measured relative humidity data in the data logger;
    measuring ambient temperature and storing the measured ambient temperature data in the data logger;
    measuring surface temperature of the capacitance sensor of the supporting structure and storing the measured surface temperature data in the data logger;
    processing the capacitance data, the relative humidity data, the ambient temperature data, and the surface temperature data in a computer to determine the level of contamination based on calibration data stored in the computer.

Preferably, the step of attaching includes selecting insulated wires as the at least two conductors and spirally winding the insulated wires about the supporting structure.

In another embodiment of the present invention, the step of attaching includes depositing the at least two conductors in the form of metal films onto the support structure.

Accordingly, the inventive sensor comprises a supporting structure, preferably an axial-symmetrical supporting structure, a sensing capacitor with at least two conductors, insulated relative to one another and positioned at the surface of the supporting structure, temperature sensor for measuring the ambient temperature, a surface temperature sensor connected to the surface of the sensing capacitor, and a hygrometer mounted on or near the supporting structure.

The at least two conductors can be in the form of two small, insulated wires wrapped in a tight spiral about the supporting structure. The wrapped spiral can be attached with a silicone adhesive or any other suitable adhesive to a portion or the entire surface of the supporting structure which functions as a surrogate insulator body.

It is possible to replace the at least two wires by any other electrically conducting material with any cross-sectional geometry, i.e., the conductors need not be wires of a circular cross-section. Instead of wrapping or winding the wires in a spiral pattern about the supporting structure, they could be laid in any compact pattern just below the nonconductive surface, for example, in a zigzag pattern, in a radial patterns or in a wavy pattern. Essentially, if the first wire is "x" and the second wire is "y", then any pattern in which a compact array of . . . xyxyxyxyxy . . . results is feasible. It is also possible to embed a plurality of wires in the non-conducting surface. It is not necessary to cover the entire surface with wires, but this will increase the accuracy of the measurement.

The conductors can also be in the form of metal films deposited onto the surface of the supporting structure by vapor deposition or etching or other known methods of the art. The resulting at least two substantially parallel metal film conductors are to be covered with a layer of thin insulating material.

Any insulating material known in the art such as, for example, plastic or rubber, can be employed to insulate the at least two conductors relative to one another.

The supporting structure is a "surrogate" insulator body. It is preferably of the same shape as the insulators provided at the power line in order to provide the same contamination deposition conditions as on the insulators themselves. Thus, the supporting structure with the sensing capacitor becomes contaminated in the same manner and at the same rate as a nearby energized insulator of the power line. However, any other suitable shape can be selected for the supporting structure.

If the source of contamination is relatively constant as, for example, in the case of a power line running parallel to the sea coast, the devices could be placed at certain intervals, for example, from 10 to 50 miles apart. The spacing will depend on the actual conditions at the site with regard to countryside, weather patterns, flora, proximity to man-made structures etc. If the source is a localized source or point source of contamination, the inventive sensor or sensors should be placed near that source.

The inventive device includes the following components. The contamination sensor in the form of the sensing capacitor with at least two conductors attached to a supporting structure is mounted at the power line at a selected location where contamination levels are to be measured in close proximity to an actual insulator so as to be exposed to the same level of contamination. A capacitance measuring device, preferably in the form of an RC member circuit, is connected to the sensing capacitor. Furthermore, one temperature sensor is connected to the surface of the sensing capacitor and another temperature sensor is provided to measure the ambient temperature. A hygrometer is mounted on or near the supporting structure. The readings of the sensing capacitor, the temperature sensors, and the hygrometer are recorded with a data logger and evaluated with a remote processing device, i.e., a computer at a remote location.

The operation of the inventive device is based on two physical principles. First, liquid water has a much greater dielectric constant than air. Thus, when water is present on the conductors, the capacitance will increase dramatically. Condensation of water on clean surfaces begins at 100% relative humidity (effect A), but condensation of water on surfaces contaminated with electrolytic salts begins at about 60% relative humidity (effect B). Thus, according to effect A, the capacitance of the two conductors of the support structure increases when liquid water is present on the non-conducting surface of the supporting structure. When the relative humidity is between 60 and 100% and contamination is present, the effects A and B in combination cause an increase of the capacitance of the two conductors due to early condensation of water in the presence of contamination (i.e., electrolytic salts etc.). Also, for a given relative humidity, the greater the amount of contamination on the non-conducting surface (and thus the amount of contaminants dissolved in condensed water), the greater the increase of the capacitance of the conductors.

The basic detection principle of the present invention is as follows. The capacitance of two conductors at the surface of the insulator is measured. The capacitance changes with condensation of water on the surface of the conductors. The condensation is a function of the relative humidity and the amount of contamination on the surface. Thus, by measuring the capacitance and at the same time the relative humidity, the amount of contamination can be computed with the aid of calibration curves stored within a computing device.

The circuit for measuring the change in capacitance of the device is a well-known circuit of the prior art employing an RC member (resistor and capacitor) to produce a resonance frequency which is proportional to the inverse product of the value of the resistor and the value of the capacitance, i.e., $RF=K/(R \times C)$ with RF being the resonance frequency, K being a constant, R being the resistance value of the resistor, and C being the capacitance value of the capacitor. The resistor in the inventive device is kept constant. Thus, if C increases, RF will decrease. The data logger measures and records the resonance frequency of the RC member circuit as a measure for the capacitance.

Such a circuit is the preferred embodiment for measuring the capacitance. However, any device capable of measuring capacitance could be used in this context.

The relative humidity at the surface of the sensing capacitor is obtained from the relative humidity of the air (hygrometer reading), the air temperature, and the temperature of the surface of the sensing capacitor.

Thus, by performing a series of calibrations for the inventive device, the user can determine the presence of contamination on the non-conducting surface, but also the amount of contamination on the non-conducting surface for the respectively determined relative humidity at the surface of the sensing capacitor.

The entire inventive system comprises two main systems: measuring or data acquisition equipment, i.e., the actual contamination sensor in the form of the sensing capacitor, hygrometer, temperature sensors, data logger, and data processing equipment. Preferably, the array of sensors deployed near the power line is combined with a data logger on site and, for remote data processing, a computer such as a personal computer is provided at a monitoring station which calls the data logger via modem, downloads the data collected and stored in the data logger, and determines the level of contamination using the previously obtained calibration curves. This can be done daily or at any other suitable interval.

When a contamination level is detected that reaches or surpasses the predetermined critical limit for flashovers, a cleaning crew is sent out to wash off the insulators. Thus, crews will only be sent when necessary. A regular maintenance schedule is no longer needed.

It would also be possible to provide the data processing equipment on site and access the processed contamination level data by modem or by direct connection.

The data logger must have a suitable interface for the various sensors. The data logger should preferably provide sensor excitation capabilities as well as processing and storing capabilities.

The inventive device may further advantageously comprise a sensor for wind speed and wind direction. It also may comprise a rain gauge. The respective data are also collected with the data logger and may provide additional data for verification purposes, i.e., as an independent control function for the contamination level determination based on capacitance.

The power supply of the contamination sensor may be in the form of photovoltaic cells or batteries such as lead/acid type batteries or gel cells.

In order to have remote access to the collected data, the data logger must be provided with a modem so that the data can be transferred to the remote data processing device, for example, in the simplest case, a personal computer.

BRIEF DESCRIPTION OF THE DRAWINGS

The object and advantages of the present invention will appear more clearly from the following specification in conjunction with the accompanying tables and drawings, in which.

DESCRIPTION OF PREFERRED EMBODIMENT

The present invention will now be described in detail with the aid of a specific embodiment utilizing FIGS. 1 through 5.

Figure 1:
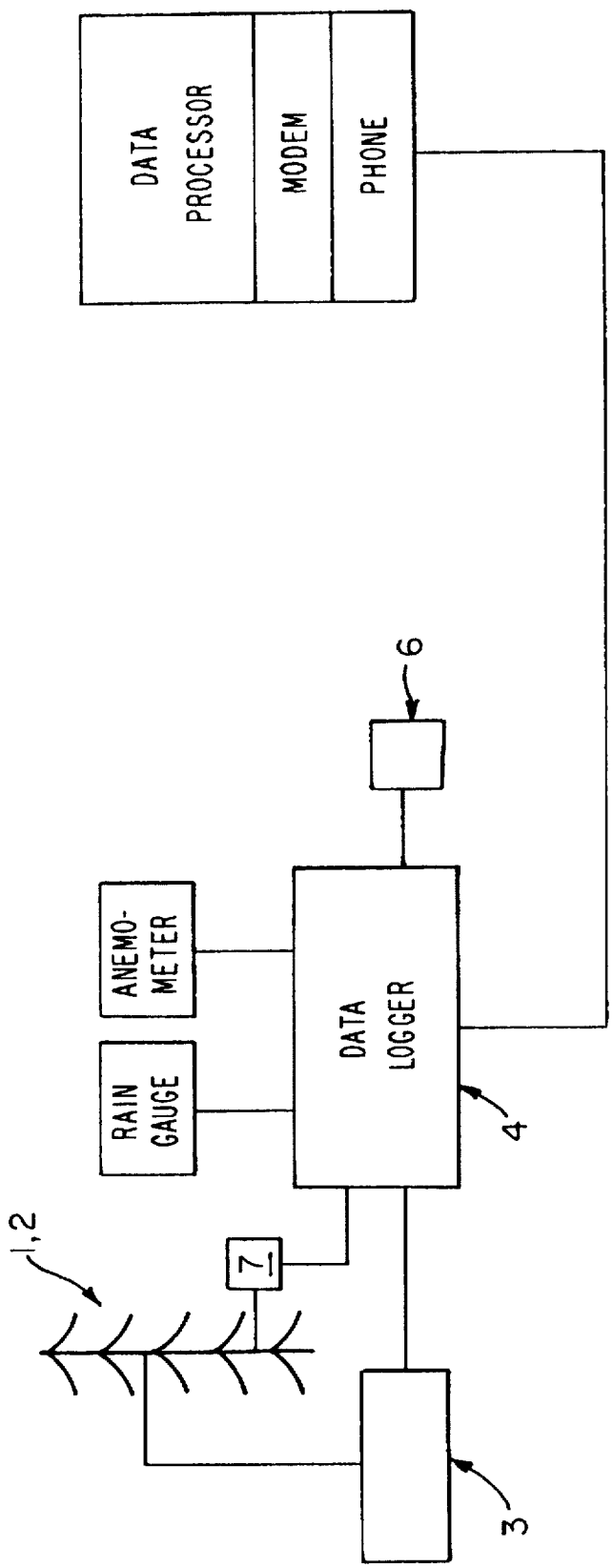
FIG. 1 is a block diagram showing the components of the inventive device.
Figure 2:
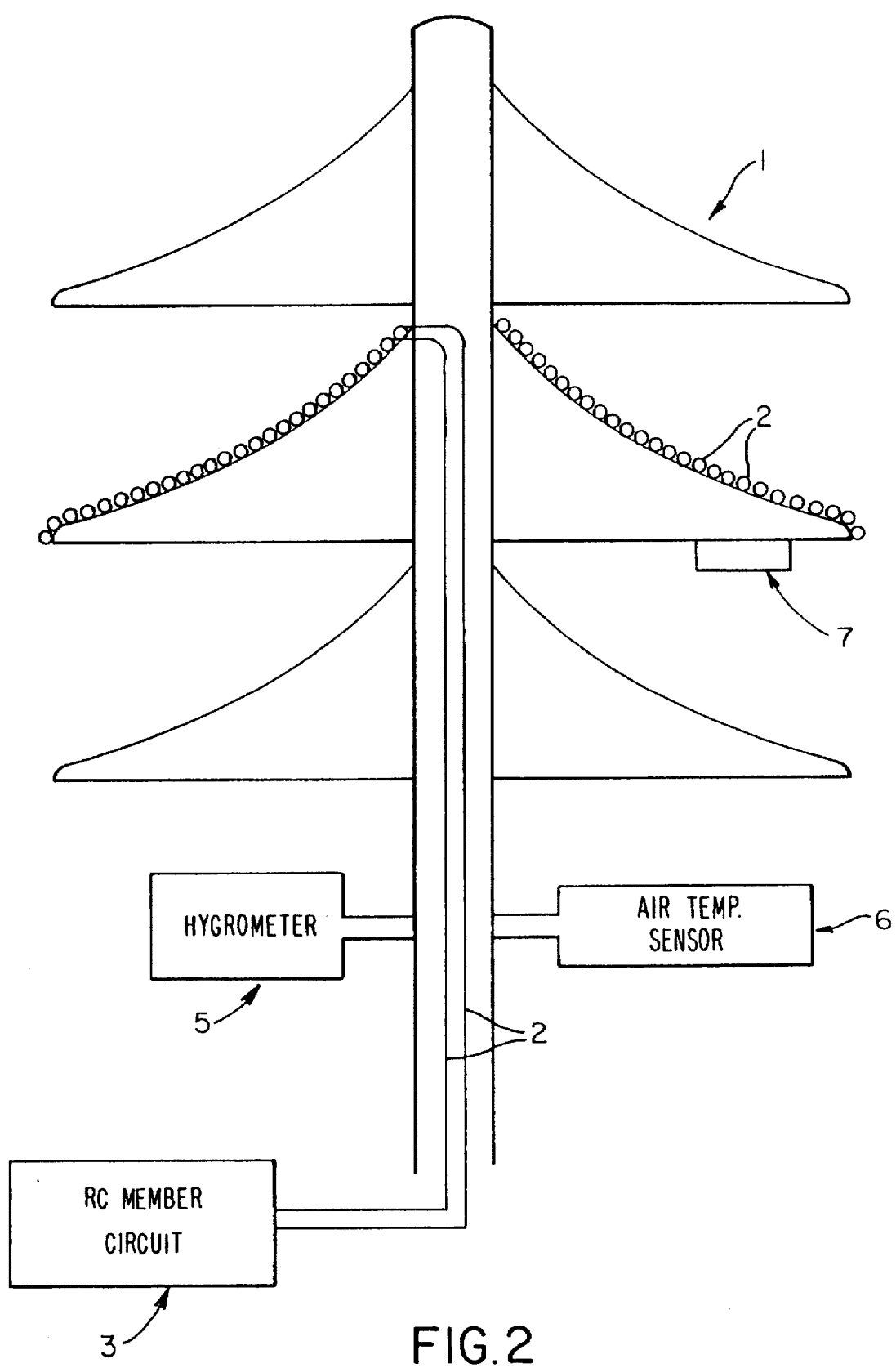
FIG. 2 is a schematic representation of the supporting structure and the sensing capacitor connected thereto.

The inventive device (FIG. 1) is comprised of a supporting structure 1 having a shape that is preferably similar to the shape of the insulators being monitored along the power line. On the surface of the supporting structure 1 conductors, in the shown preferred embodiment in the form of insulated wires 2, are arranged (FIG. 2). They are wound tightly about the surface of the supporting structure 1 and connected thereto, for example, with an adhesive. In an alternative embodiment, they can also be embedded in the surface of the supporting structure. The free ends of the insulated wires 2 are connected to a well-known RC member circuit 3.

The RF (resonance frequency) data measured by the RC member circuit 3 are supplied to a data logger 4.

Also connected to the data logger 4 are a hygrometer 5 for measuring the relative humidity of the air, a temperature sensor 6 for measuring the ambient air temperature, and a temperature sensor 7, preferably a radiation sensor, attached to the surface of the sensing capacitor, for measuring the surface temperature thereof.

The data logger 4 comprises a data memory and a sensor excitation unit for the hygrometer and the temperature sensors. Thus, with the data logger 4 the data received from the hygrometer 5 and the temperature sensors 6 and 7 as well as the RF data from the RC member circuit 3 are being logged. The logged data are stored as "raw" data (unprocessed data as logged) in the data memory.

The inventive device is set up for remote access. The data logger thus comprises a data modem accessible, for example, by cellular phone. Thus, the memory of the data logger can be tapped and, depending on the operational mode of the device, the "raw" data can be retrieved and computed in a data processing device such as a personal computer located off-site at a monitoring station.

It is, of course, also possible to provide the data logger with a data processor so that the data can be processed in the data processor on site in order to determine the contamination level parameter based on the logged data immediately after data acquisition. The respective computed contamination level parameters can then be stored in the data memory and retrieved later via modem into a remote data processing device for display or print-out etc.

Condensation chamber testing of the inventive device in conjunction with artificially contaminated surfaces at operating voltages has shown that the inventive device behaves identically to an insulator in service. The testing chamber results can therefore be used for calibration purposes to be able to correlate the data, measured in practice with the inventive device, to the amount of contamination on the insulator at the measuring location.

The initial condensation chamber experiments showed that the level of contamination could be measured within an error margin of 15% with the inventive device.

Figure 3:
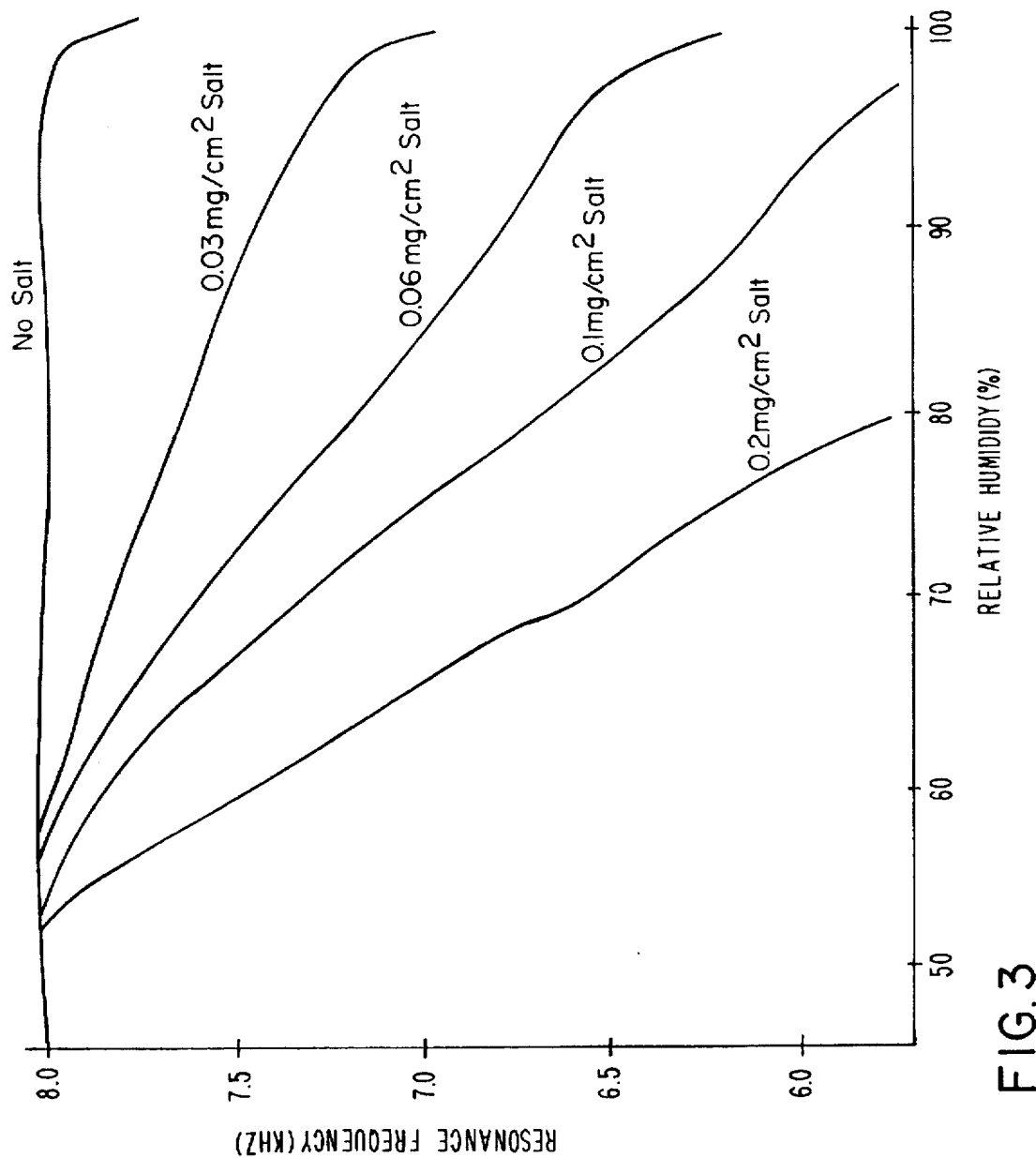
FIG. 3 is a graph showing calibration curves for various contamination levels, wherein the resonant frequency as a measure of capacitance is plotted against the relative humidity at the sensing capacitor surface.

Condensation chamber results for various artificially generated contamination levels are represented in FIG. 3, showing the change of frequency as a function of increasing humidity for various amounts of salt per surface area. These and similar results were used to determine the contamination levels on power lines in practical testing of the inventive device.

In the following a comparative experiment in which the inventive device and a conventional leakage current sensor are tested in service on a power line is presented and discussed.

Figure 4:
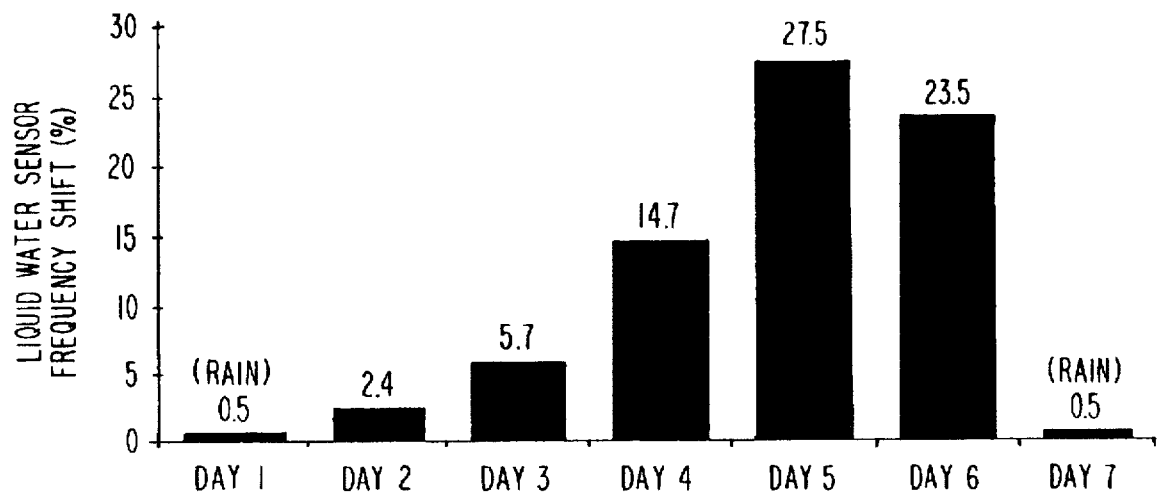
FIG. 4 shows a graph indicating the contamination level measured by the inventive device over a period of 7 consecutive days.

An inventive device and a conventional leakage current sensor were installed adjacent one another on a power line at Juno Beach, Fla., and then tested over a time period of several months. A period of seven days in which heavy contamination occurred, is represented in the drawings FIGS. 4 and 5. FIG. 4 shows the level of contamination as an index derived from the capacitance data measured with the inventive device. The index is based on calibration of the system in a testing chamber (see calibration graph of FIG. 3) and reflects the frequency shift in percent.

The following scale has been established for the contamination level:

| Index (% frequency shift) | Contamination Level |
| --- | --- |
| >30 | Very Heavy |
| 20–30 | Heavy |
| 10–20 | Moderate |
| 5–10 | Light |
| 0–5 | Clean |

The graph of FIG. 4 shows that over the period of day 1 (rain) to 3 the contamination level slowly increased. At day 4 the contamination level was in the moderate range and at days 5 and 6 it was heavy. At day 7 it rained and the contamination was washed off; thus, the contamination level was low, as indicated by the index (0.5=clean).

For leakage current sensors a contamination correlation to the measured current (as determined by calibration in a testing chamber) is as follows:

| Measured Current | Contamination |
|---|---|
| >500 mA | Very Heavy |
| 50–300 mA | Heavy |
| 5–50 mA | Moderate |
| 3–5 mA | Light |
| <3 mA | Clean |

Figure 5:
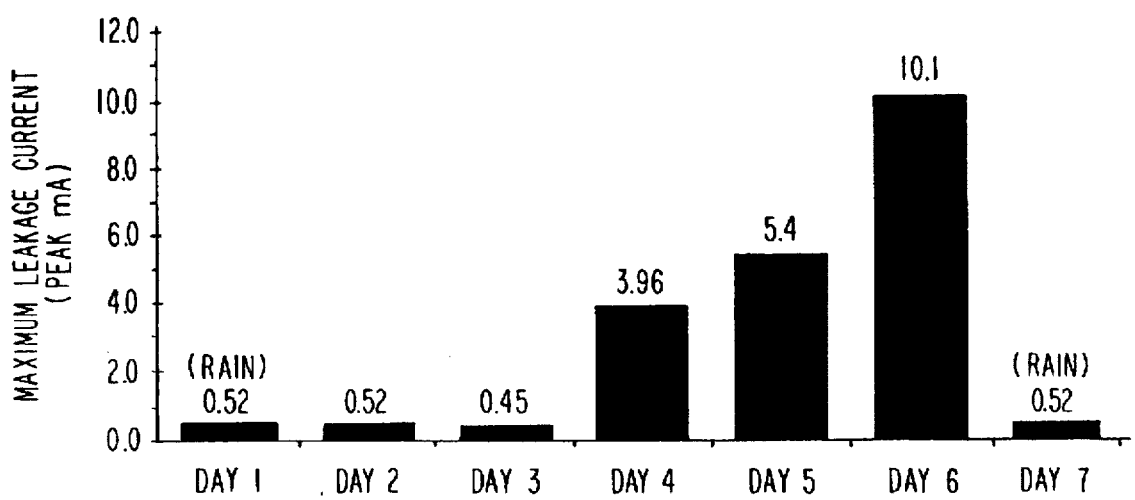
FIG. 5 shows as a comparison to FIG. 3 a graph indicating the leakage current level measured with a leakage current measuring device over the same 7-day period as in FIG. 3.

In comparison, the leakage current graph of FIG. 5 shows that for the same days 1–3 no increase of contamination was observed. Day 4 showed a light contamination level. Day 5 showed a light to moderate contamination level. Day 6 showed a moderate contamination level. Thus, while the inventive device showed at days 5 and 6 a heavy contamination level and thus a great risk for flashovers, the leakage current sensor indicated only a moderate contamination level (at the low end of the scale) and thus a low risk for flashovers.

This comparative example shows the superiority of the inventive device for detecting critical contamination levels and thus critical flashover conditions. The inventive device provides a reliable, inexpensive sensor for determining the risk of flashover on power lines.

The present invention is, of course, in no way restricted to the specific disclosure of the specification, examples and drawings, but also encompasses any modifications within the scope of the appended claims.

What we claim is:

1. A remote contamination sensing device for contamination on insulation of electric power lines and substations; said contamination sensing device comprising:

a data logger;

a supporting structure;

a sensing capacitor comprising at least two conductors attached to said supporting structure so as to be spaced apart and insulated from each other;

a capacitance measuring device, for measuring the capacitance between said conductors, connected to said data logger;

a hygrometer, for measuring the relative humidity of the ambient air, connected to said data logger;

a first temperature sensor, for measuring the ambient temperature, connected to said data logger;

a second temperature sensor, for measuring the surface temperature of said capacitance sensor, connected to said data logger;

said measured capacitance data, said measured relative humidity data, said measured ambient temperature data, and said measured surface temperature data stored in said data logger;

a computer for processing said capacitance data, said relative humidity data, said ambient temperature data, and said surface temperature data to determine the level of contamination based on calibration data stored in the computer.

2. A sensing device according to claim 1, wherein said at least two conductors are insulated wires wound spirally about said supporting structure.

3. A sensing device according to claim 1, wherein said at least two conductors are metal films deposited onto said support structure.

4. A method of remotely sensing contamination on insulation of electric power lines and substations; said method comprising the steps of:

attaching a sensing capacitor to a supporting structure, said sensing capacitor comprising at least two conductors so as to be spaced apart and insulated from one another;

placing the supporting structure with the sensing capacitor proximate to the insulation to be monitored;

measuring the capacitance between said conductors and storing the measured capacitance data in a data logger;

measuring the relative humidity of the ambient air and storing the measured relative humidity data in the data logger;

measuring the ambient temperature and storing the measured ambient temperature data in the data logger;

measuring the surface temperature of the capacitance sensor of the supporting structure and storing the measured surface temperature data in the data logger;

processing the measured capacitance data, the measured relative humidity data, the measured ambient temperature data, and the measured surface temperature data in a computer to determine the level of contamination based on calibration data stored in the computer.

5. A method according to claim 4, wherein the step of attaching includes selecting insulated wires as said at least two conductors and spirally winding said insulated wires about said supporting structure.

6. A method according to claim 4, wherein the step of attaching includes depositing said at least two conductors in the form of metal films onto said support structure.

* * * * *